United States Patent
Yoon et al.

(10) Patent No.: US 8,124,459 B2
(45) Date of Patent: Feb. 28, 2012

(54) BUMP CHIP CARRIER SEMICONDUCTOR PACKAGE SYSTEM

(75) Inventors: In Sang Yoon, Ichon-si (KR); Han Shin Youn, Icheon-si (KR); Jae Soo Lee, Icheon-si (KR)

(73) Assignee: Stats Chippac Ltd., Singapore (SG)

( * ) Notice: Subject to any disclaimer, the term of this patent is extended or adjusted under 35 U.S.C. 154(b) by 992 days.

(21) Appl. No.: 11/306,806

(22) Filed: Jan. 11, 2006

(65) Prior Publication Data

US 2007/0108605 A1    May 17, 2007

Related U.S. Application Data

(60) Provisional application No. 60/594,615, filed on Apr. 23, 2005.

(51) Int. Cl.
*H01L 21/50* (2006.01)

(52) U.S. Cl. ........ 438/123; 257/676; 257/666; 257/787; 257/778

(58) Field of Classification Search ............ 257/676, 257/666, 787, 778

See application file for complete search history.

(56) References Cited

U.S. PATENT DOCUMENTS

| | | | | |
|---|---|---|---|---|
| 4,890,152 A | * | 12/1989 | Hirata et al. | 257/666 |
| 6,476,503 B1 | | 11/2002 | Imamura et al. | 257/780 |
| 6,541,848 B2 | | 4/2003 | Kawahara et al. | 257/690 |
| 6,815,833 B2 | * | 11/2004 | Lee et al. | 257/778 |
| 6,876,084 B2 | | 4/2005 | Hsu | 257/773 |
| 6,933,598 B2 | | 8/2005 | Karnezos | 257/686 |
| 7,189,593 B2 | * | 3/2007 | Lee | 438/107 |
| 7,202,460 B2 | * | 4/2007 | Onodera et al. | 250/208.1 |
| 2003/0168256 A1 | * | 9/2003 | Chien | 174/264 |

* cited by examiner

*Primary Examiner* — Samuel Gebremariam
(74) *Attorney, Agent, or Firm* — Mikio Ishimaru

(57) ABSTRACT

A bump chip carrier semiconductor package system is provided including providing a lead frame, forming circuit sockets in the lead frame, mounting a semiconductor die on the lead frame, wherein the semiconductor die have electrical interconnects that connects to the circuit sockets, and encapsulating a molding compound to cover the semiconductor die and the electrical interconnects.

20 Claims, 8 Drawing Sheets

BUMP CHIP CARRIER SEMICONDUCTOR PACKAGE SYSTEM

CROSS-REFERENCE TO RELATED APPLICATION(S)

This application claims the benefit of U.S. Provisional Patent Application Ser. No. 60/594,615 filed Apr. 23, 2005, and the subject matter thereof is hereby incorporated herein by reference thereto.

TECHNICAL FIELD

The present invention relates generally to integrated circuit packages and more particularly to bump chip carrier semiconductor packages.

BACKGROUND ART

Modern consumer electronics, such as cellular phones, digital cameras, and music players, require shrinking integrated circuits and packing more integrated circuits into an ever shrinking physical space. Numerous technologies have been developed to meet these requirements. One of these technologies involves packaging integrated circuits with increasing pin count while reducing the total package height.

As integrated circuits geometries continue to shrink, more functions are typically packed into an integrated circuit device. The additional functionality typically implies more pins are needed to support the input and output interfaces to the higher level system. The market requires the smallest form factor along with the increased functionality and higher pin count.

Integrated circuit (IC) devices have reached a stage of maturity where various packaging methods have been disclosed over the last few years. Leaded Bump Chip Carrier (BCC) technology produces a chip scale lead frame based molded package with bumps, which are formed after the lead frame is etched away. An exposed die pad coupled with extremely low resistance, inductance, and capacitance (RLC) provides excellent electrical and thermal performance enhancements, which are ideal for consumer electronics. The BCC is manufactured in a molded array format that maximizes product throughput and material utilization. The BCC may have single row and dual row bumps. However, as technology advances the demand increases for lower package profiles, increased input/output counts, and better electrical performance.

Thus, a need still remains for an integrated circuits package system providing high pin count support as well as long package height. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides providing a lead frame, forming circuit sockets in the lead frame, mounting a semiconductor die on the lead frame, wherein the semiconductor die have electrical interconnects that connects to the circuit sockets, and encapsulating a molding compound to cover the semiconductor die and the electrical interconnects.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. The same numbers are used in all the figures to relate to the same elements.

The term "horizontal" as used herein is defined as a plane parallel to the conventional integrated circuits surface, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material, patterning, exposure, development, etching, cleaning, molding, and/or removal of the material or as required in forming a described structure.

Figure 1:
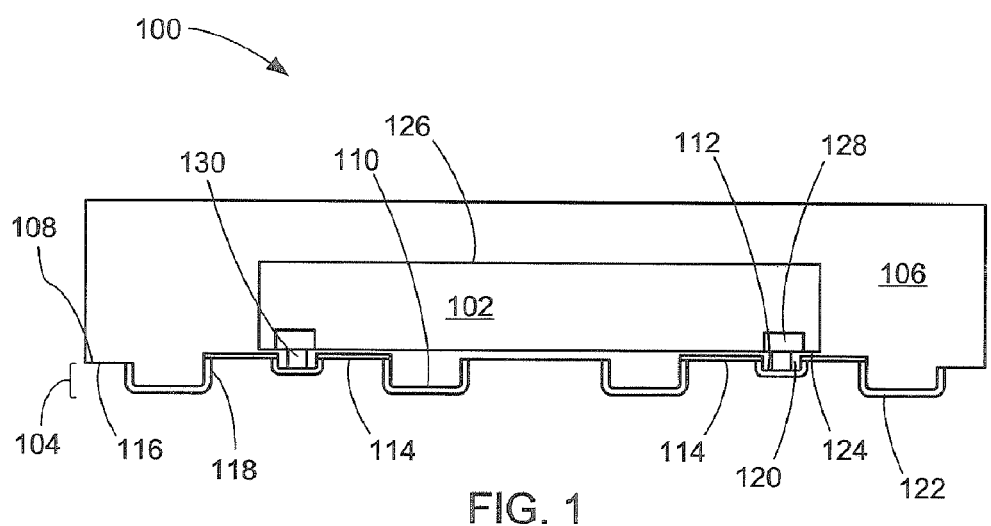
FIG. 1 is a cross-sectional view of a bump chip carrier semiconductor package system in an embodiment of the present invention.

Referring now to FIG. 1, therein is shown a cross-sectional view of a bump chip carrier semiconductor package system 100 in an embodiment of the present invention. The bump chip carrier semiconductor package system 100 includes a semiconductor die 102, such as a flip chip, on a bump chip carrier lead frame 104. A molding compound 106 covers the semiconductor die 102 and a top side 108 of the bump chip carrier lead frame 104.

The bump chip carrier lead frame 104 includes terminal bumps 110, concave circuit sockets 112, such as flip chip bond paddles, and lead frame interconnects 114. The semiconductor die 102 is mounted facing the concavities of the concave circuit sockets 112. The lead frame interconnects 114 electrically connect the terminal bumps 110 to the circuit sockets 112 as desired. The bump chip carrier lead frame 104 also includes a bottom side 116, wherein the bottom side 116 includes elevated surfaces 118. The elevated surfaces 118 are formed on the bottom side 116 between the instances of the terminal bumps 110, the terminal bumps 110 and the circuit sockets 112, and the terminal bumps 110 and a peripheral boundary of the bump chip carrier lead frame 104. The elevated surfaces 118 may expose the lead frame interconnects 114 or may be covered by the molding compound 106. Socket bottoms 120 of the circuit sockets 112 may be exposed or may be covered by the molding compound 106. Bump bottoms 122 of the terminal bumps 110 extend vertically below the socket bottoms 120 of the circuit sockets 112 such that the terminal bumps 110 on the bottom side 116 connect to a higher system level (not shown).

The semiconductor die 102 includes an active side 124 and a non-active side 126, wherein the active side 124 includes the predetermined circuitry fabricated thereon. The active side 124 also includes bonding pads 128 electrically connected to electrical interconnects 130, such as flip chip bumps, stud bumps, solder bumps, or electroless bumps. The semiconductor die 102 is above the top side 108 of the bump chip carrier lead frame 104 such that the electrical interconnects 130 extend into and connect to bottoms of the circuit sockets 112, as desired. The molding compound 106 fills a space around the electrical interconnects 130. The proximity of the circuit sockets 112, to each other, may be on an integrated circuit scale and may decrease yield or may not meet spacing requirements for printed circuit board manufacture. The lead frame interconnects 114 redistribute the electrical signals from the circuit sockets 112 to the terminal bumps 110, which are spaced to satisfy and alleviate printed circuit board manufacturing requirements.

Figure 2:
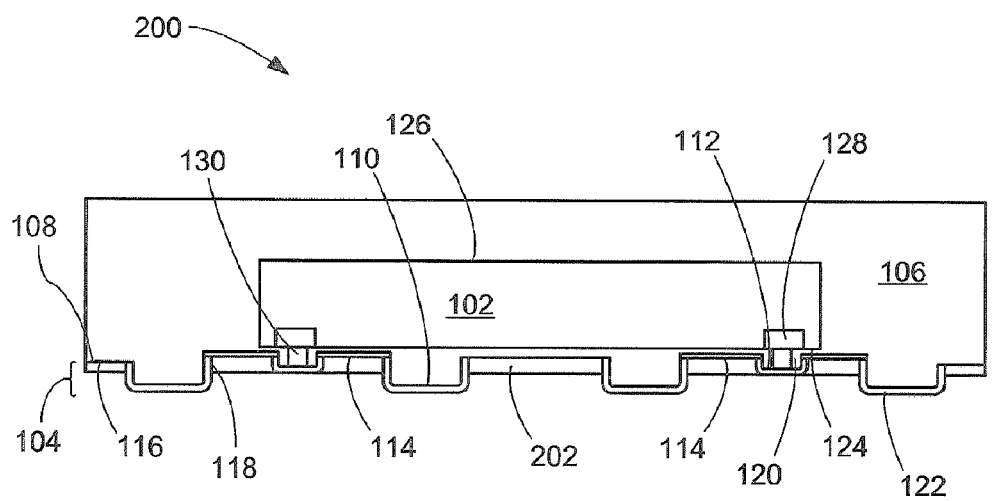
FIG. 2 is a cross-sectional view of a bump chip carrier semiconductor package system with a trace protective material in an alternative embodiment of the present invention.

Referring now to FIG. 2, therein is shown a cross-sectional view of a bump chip carrier semiconductor package system 200 with a trace protective material 202 in an alternative embodiment of the present invention. Similar to the bump chip carrier semiconductor package system 100 of FIG. 1, the bump chip carrier semiconductor package system 200 includes the semiconductor die 102 and the bump chip carrier lead frame 104. The molding compound 106 covers the semiconductor die 102 and the top side 108 of the bump chip carrier lead frame 104. The electrical interconnects 130 attach to the bonding pads 128 of the semiconductor die 102, wherein the electrical interconnects 130 are on the circuit sockets 112, as desired.

The bump chip carrier lead frame 104 includes the terminal bumps 110, the circuit sockets 112, and the lead frame interconnects 114. The lead frame interconnects 114 electrically connect the terminal bumps 110 to the circuit sockets 112 as desired. The bump chip carrier lead frame 104 also includes the bottom side 116, wherein the bottom side 116 includes the elevated surfaces 118.

The trace protective material 202, such as photosensitive resister (PSR), may cover the elevated surfaces to insulate and protect the lead frame interconnects 114 as well as help seal, such as hermetically seal, the bump chip carrier semiconductor package system 200. For illustrative purposes, the trace protective material 202 is shown leaving the socket bottoms 120 of the circuit sockets 112 exposed, although it is understood that the trace protective material 202 may not leave the socket bottoms 120 of the circuit sockets 112 exposed, as well. The socket bottoms 120 preferably extend vertically below the bottom side 116 of the bump chip carrier lead frame 104.

Figure 3:
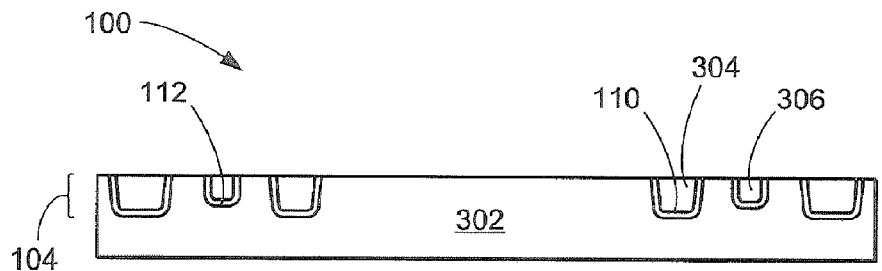
FIG. 3 is a cross-sectional view of a bump chip carrier semiconductor package system in a preparation phase of an unsingulated lead frame.

Referring now to FIG. 3, therein is shown a cross-sectional view of the bump chip carrier semiconductor package system 100 in a preparation phase of an unsingulated lead frame 302. The cross-sectional view depicts one instance of the unsingulated lead frame 302, wherein the unsingulated lead frame 302 is part of an array having a number of instances of the unsingulated lead frame 302. The unsingulated lead frame 302 may be a conductive material, such as copper or metal alloys. The unsingulated lead frame 302 is selectively half etched forming terminal recesses 304 and pad recesses 306. The terminal recesses 304 are formed into the unsingulated lead frame 302 to a depth greater than the depth of the pad recesses 306. The unsingulated lead frame 302 may also be selectively half-etched forming interconnect channels (not shown) for the lead frame interconnects 114 shown in FIG. 1. Conductive metals, such as silver (Ag), nickel (Ni), palladium (Pd), gold (Au), or an metallic alloy, are plated in the terminal recesses 304, the pad recesses 306, and the interconnect channels forming the terminal bumps 110, the circuit sockets 112, and the lead frame interconnects 114 shown in FIG. 1, respectively, as well as the bump chip carrier lead frame 104.

Figure 4:
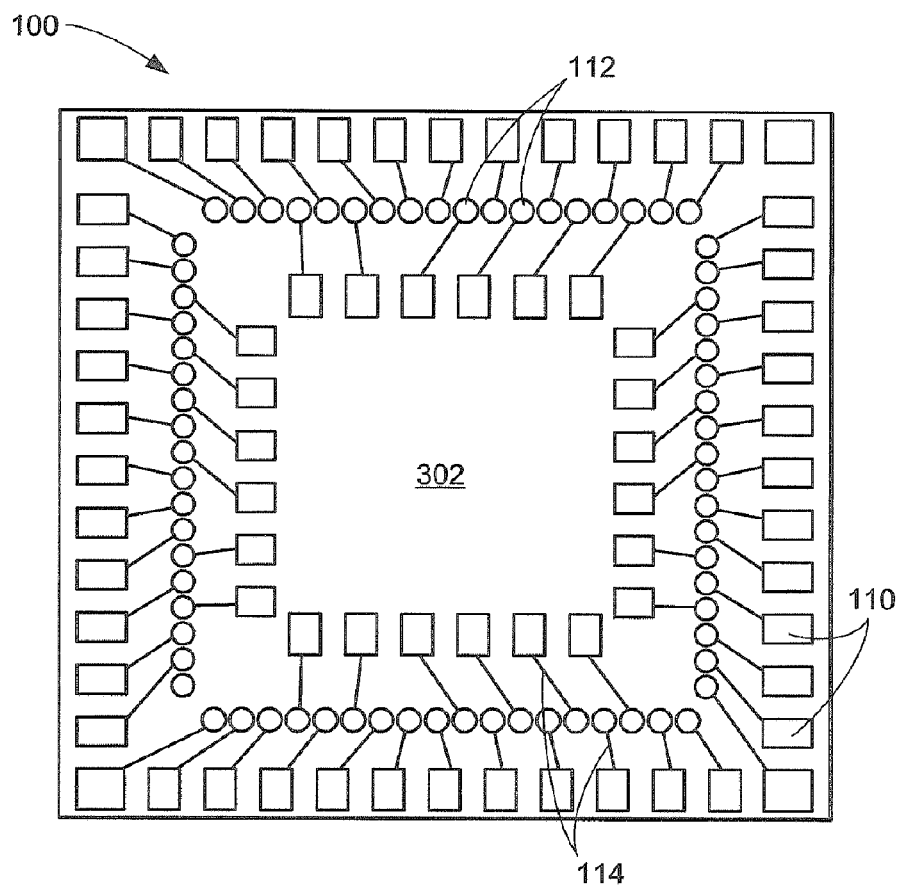
FIG. 4 is a top view of a bump chip carrier semiconductor package system in the preparation phase of the unsingulated lead frame.

Referring now to FIG. 4, therein is shown a top view of the bump chip carrier semiconductor package system 100 in the preparation phase of the unsingulated lead frame 302. The top view depicts multiple rows of the terminal bumps 110, wherein the terminal bumps 110 are formed at the boundary of the unsingulated lead frame 302 and at an inner area of the unsingulated lead frame 302. The circuit sockets 112 are formed between the terminal bumps 110 located at the boundary and the terminal bumps 110 located at the inner area. The lead frame interconnects 114 are shown electrically connecting the circuit sockets 112 to the terminal bumps 110 as desired.

For illustrative purposes, the lead frame interconnects 114 are shown electrically connecting the circuit sockets 112 to the terminal bumps 110, although it is understood that the lead frame interconnects 114 may connect the circuit sockets 112 to each other and the terminal bumps 110 to each other, as well. Also for illustrative purposes, one instance of the circuit sockets 112 is shown connected to one instance of the terminal bumps 110, although it is understood that any number of instances of the circuit sockets 112 may be connected to any number of instances of the terminal bumps 110. It is also understood that an instance of the lead frame interconnects 114 may connect any number of instances of the circuit sockets 112 to any number of instances of the terminal bumps 110. The rows of the terminal bumps 110 and the circuit sockets 112 are shown parallel to a side of the unsingulated lead frame 302, although it is understood that the terminal bumps 110 and the circuit sockets 112 may not be parallel, such as in a staggered arrangement. The lead frame interconnects 114 electrically connect the circuit sockets 112 and the terminal bumps 110, wherein the lead frame interconnects 114 distributes the terminal bumps 110 to predetermined dimensions required by the targeted next level system level connectivity, such as printed circuit board.

Figure 5:
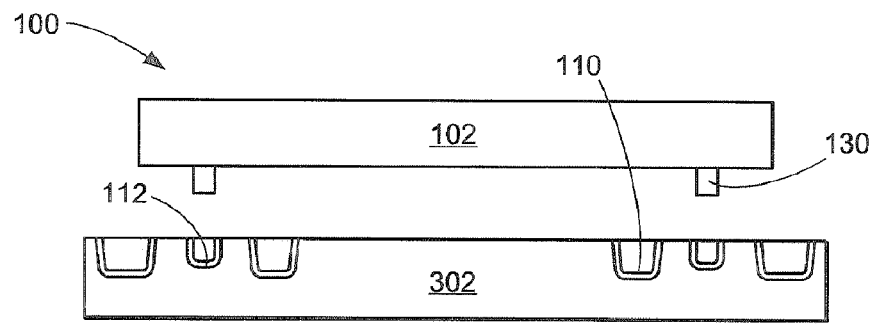
FIG. 5 is a cross-sectional view of the bump chip carrier semiconductor package system in an alignment phase of the semiconductor die.

Referring now to FIG. 5, therein is shown a cross-sectional view of the bump chip carrier semiconductor package system 100 in an alignment phase of the semiconductor die 102. The cross-sectional view depicts the semiconductor die 102 including the electrical interconnects 130 above the unsingulated lead frame 302 with the terminal bumps 110, the circuit sockets 112, and the lead frame interconnects 114 (not shown) of FIG. 1. The semiconductor die 102 undergoes alignment to the unsingulated lead frame 302 such that the electrical interconnects 130 align with the circuit sockets 112 as desired.

Figure 6:
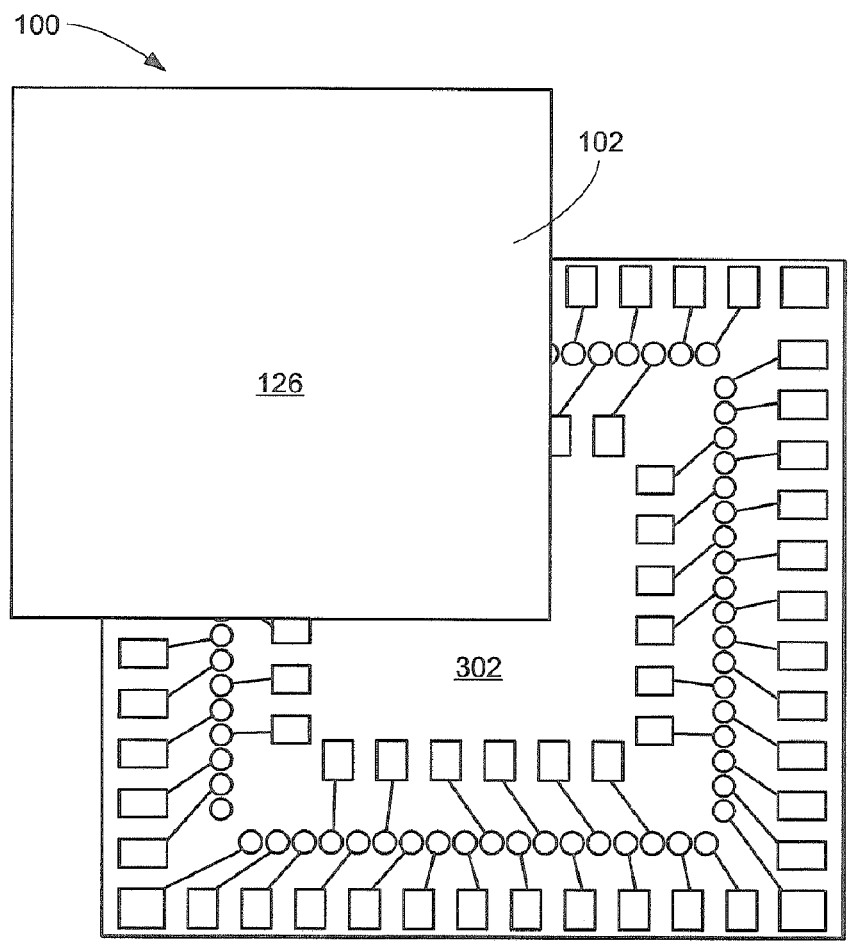
FIG. 6 is a top view of the bump chip carrier semiconductor package system in the alignment phase of the semiconductor die.

Referring now to FIG. 6, therein is shown a top view of the bump chip carrier semiconductor package system 100 in the alignment phase of the semiconductor die 102. The top view depicts the semiconductor die 102 undergoing alignment to the unsingulated lead frame 302, wherein the top view shows the non-active side 126 of the semiconductor die 102.

Figure 7:
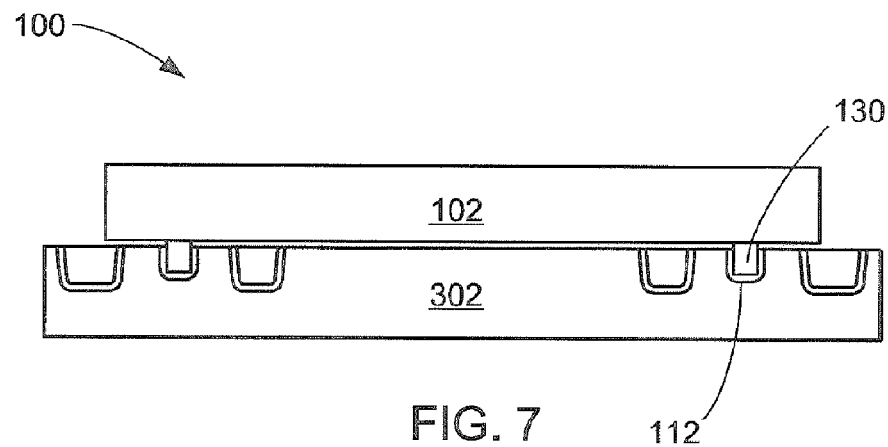
FIG. 7 is a cross-sectional view of the bump chip carrier semiconductor package system in a mounting phase of the semiconductor die.

Referring now to FIG. 7, therein is shown a cross-sectional view of the bump chip carrier semiconductor package system 100 in a mounting phase of the semiconductor die 102. The semiconductor die 102 is mounted on the unsingulated lead frame 302 with the electrical interconnects 130 are in the circuit sockets 112 as desired. The electrical interconnects 130 may bond to the circuit sockets 112 by any number of processes, such as ultrasonic, thermo compression, soldering, or using paste.

Figure 8:
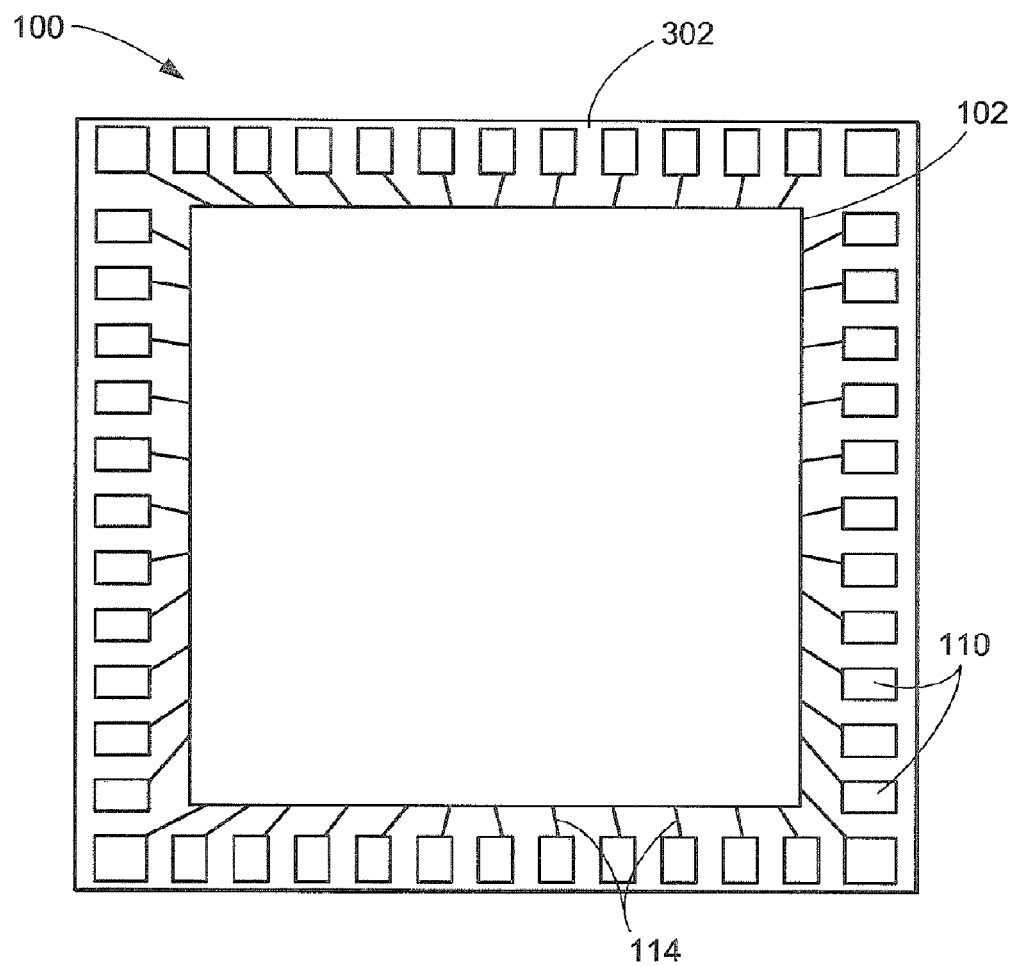
FIG. 8 is a top view of the bump chip carrier semiconductor package system in the mounting phase of the semiconductor die.

Referring now to FIG. 8, therein is shown a top view of the bump chip carrier semiconductor package system 100 in the mounting phase of the semiconductor die 102. The top view depicts the semiconductor die 102 over the unsingulated lead frame 302. The terminal bumps 110 located at the boundary of the unsingulated lead frame 302 are shown. The lead frame interconnects 114 are shown connecting from the terminal bumps 110 to connections below the semiconductor die 102.

Figure 9:
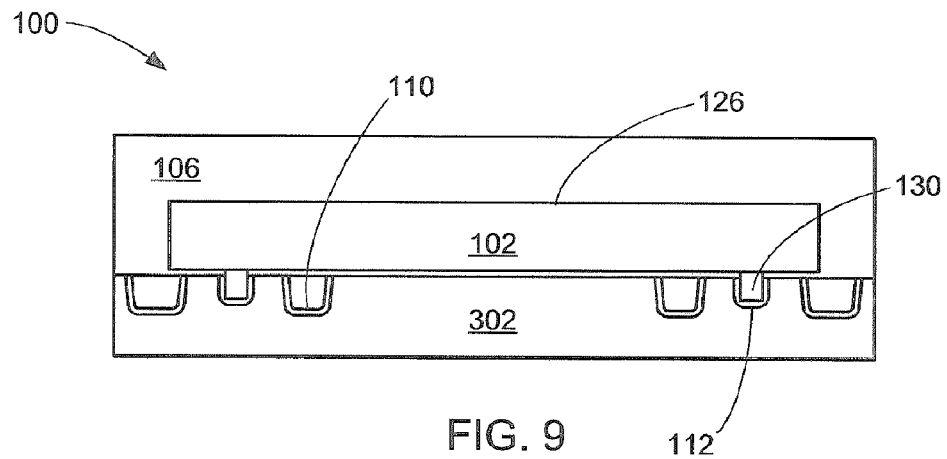
FIG. 9 is a cross-sectional view of the bump chip carrier semiconductor package system in an encapsulation phase.

Referring now to FIG. 9, therein is shown a cross-sectional view of the bump chip carrier semiconductor package system 100 in an encapsulation phase. The molding compound 106 may applied with any number of processes, such as an injection molding or press molding. The molding compound 106 covers the semiconductor die 102 and the unsingulated lead frame 302, wherein the molding compound 106 substantially fills the space between the semiconductor die 102 and the unsingulated lead frame 302 protecting the circuits on the semiconductor die 102 and the electrical interconnects 130. The molding compound 106 substantially fills the terminal bumps 110 and the space around the electrical interconnects 130 in the circuit sockets 112.

For illustrative purposes, the molding compound 106 is shown covering the non-active side 126 of the semiconductor die 102, although it is understood that the molding compound 106 may expose the non-active side 126 providing a lower profile for the bump chip carrier semiconductor package system 100. The non-active side 126 may be exposed by the encapsulation process or may be exposed by any number of processes, such as a chemical mechanical planarization (CMP).

Figure 10:
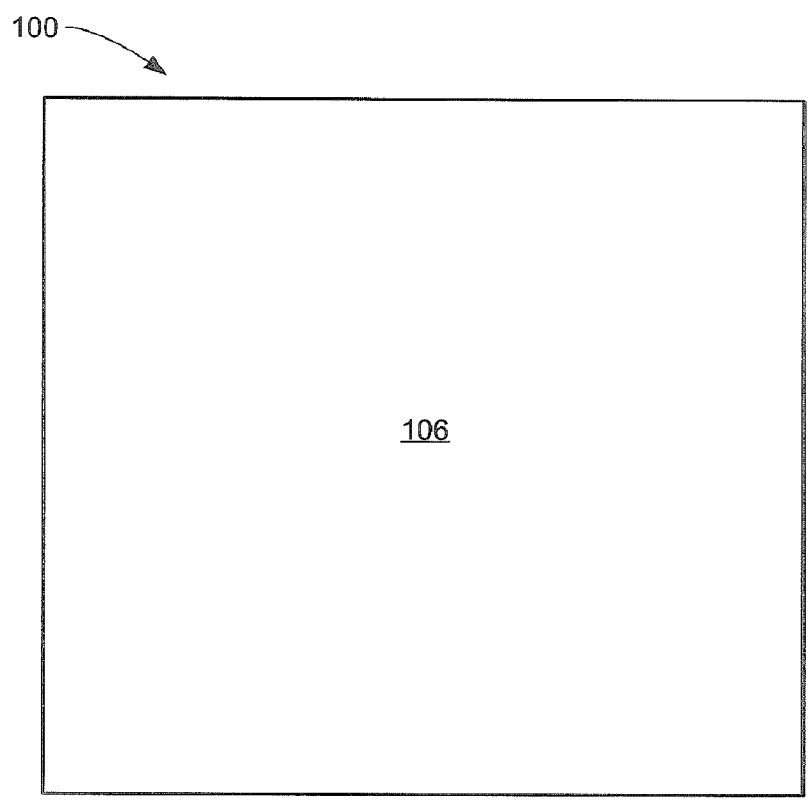
FIG. 10 is a top view of the bump chip carrier semiconductor package system in the encapsulation phase.

Referring now to FIG. 10, therein is shown a top view of the bump chip carrier semiconductor package system 100 in the encapsulation phase. The top view depicts the molding compound 106 covering the semiconductor die 102 (not shown) of FIG. 9 mounted on the unsingulated lead frame 302 (not shown) of FIG. 9.

Figure 11:
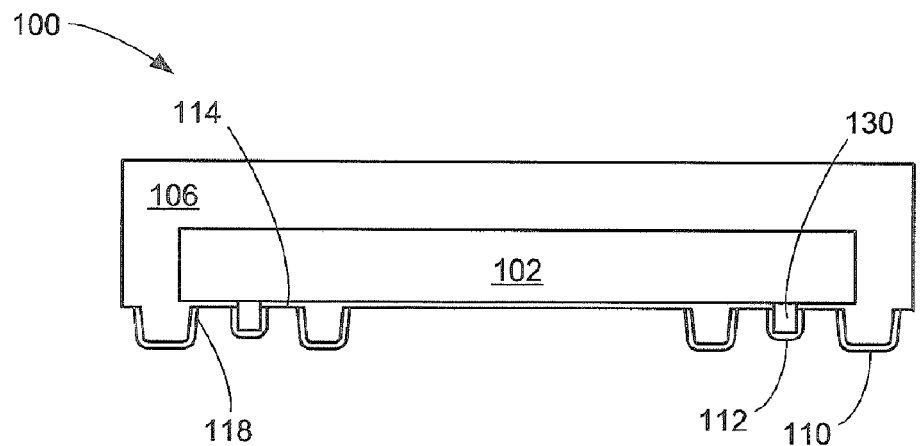
FIG. 11 is a cross-sectional view of the bump chip carrier semiconductor package system in an etching phase.

Referring now to FIG. 11, therein is shown a cross-sectional view of the bump chip carrier semiconductor package system 100 in an etching phase. Chemical etching of the unsingulated lead frame 302 shown in FIG. 9 exposes the metal plating of the terminal bumps 110, the circuit sockets 112, and the lead frame interconnects 114 as well as forms the elevated surfaces 118. The elevated surfaces 118 expose the molding compound 106 in the areas without the lead frame interconnects 114. Chemical etching may be performed using any number of chemical solutions, such as an acid type or an alkaline type.

Figure 12:
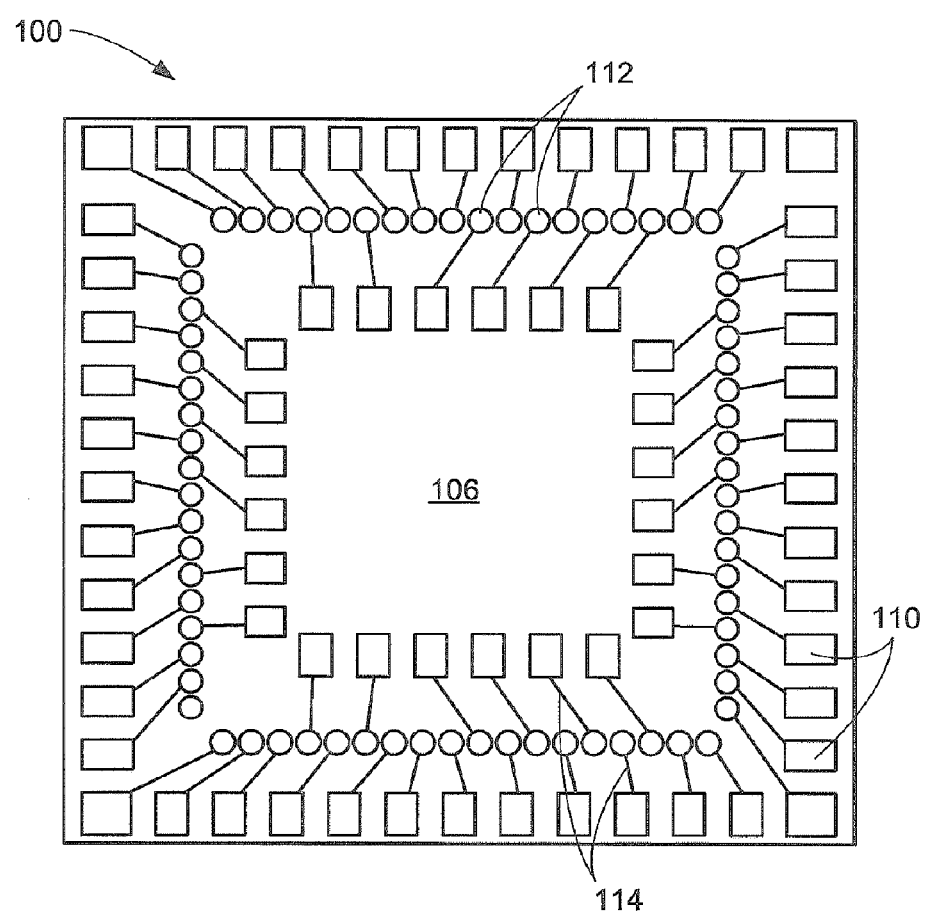
FIG. 12 is a bottom view of the bump chip carrier semiconductor package system in the etching phase.

Referring now to FIG. 12, therein is shown a bottom view of the bump chip carrier semiconductor package system 100 in the etching phase. The bottom view depicts the terminal bumps 110 at the boundary of the molding compound 106 and at the inner area of the molding compound 106. The circuit sockets 112 are shown between the terminal bumps 110 located at the boundary and the terminal bumps 110 located at the inner area. The lead frame interconnects 114 are shown electrically connecting the circuit sockets 112 to the terminal bumps 110 as desired. The molding compound 106 is shown surrounding the terminal bumps 110, the circuit sockets 112, and the lead frame interconnects 114.

Figure 13:
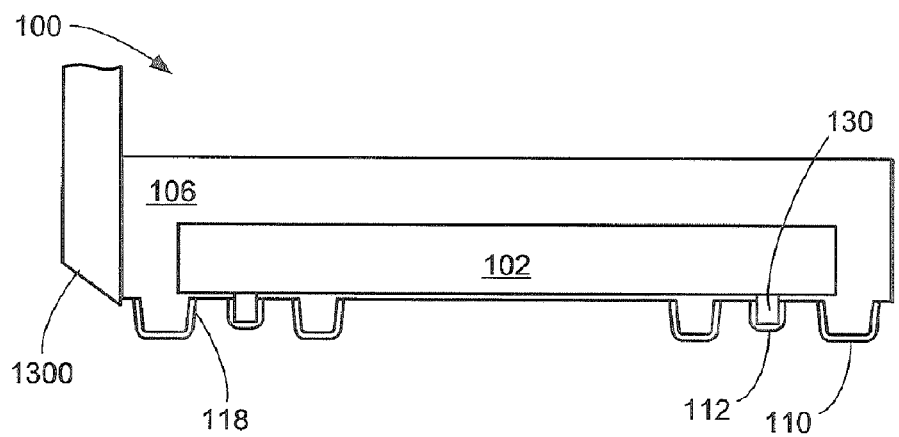
FIG. 13 is a cross-sectional view of the bump chip carrier semiconductor package system in a singulation phase.

Referring now to FIG. 13, therein is shown a cross-sectional view of the bump chip carrier semiconductor package system 100 in a singulation phase. The bump chip carrier semiconductor package system 100 having the terminal bumps 110, the circuit sockets 112, the electrical interconnects 130, and the elevated surfaces 118 exposed undergoes singulation, such as singulation by a punch or blade 1300, forming the bump chip carrier semiconductor package system 100. The separation of each instance of the bump chip carrier semiconductor package system 100 in the array accommodates for the singulation process.

Figure 14:
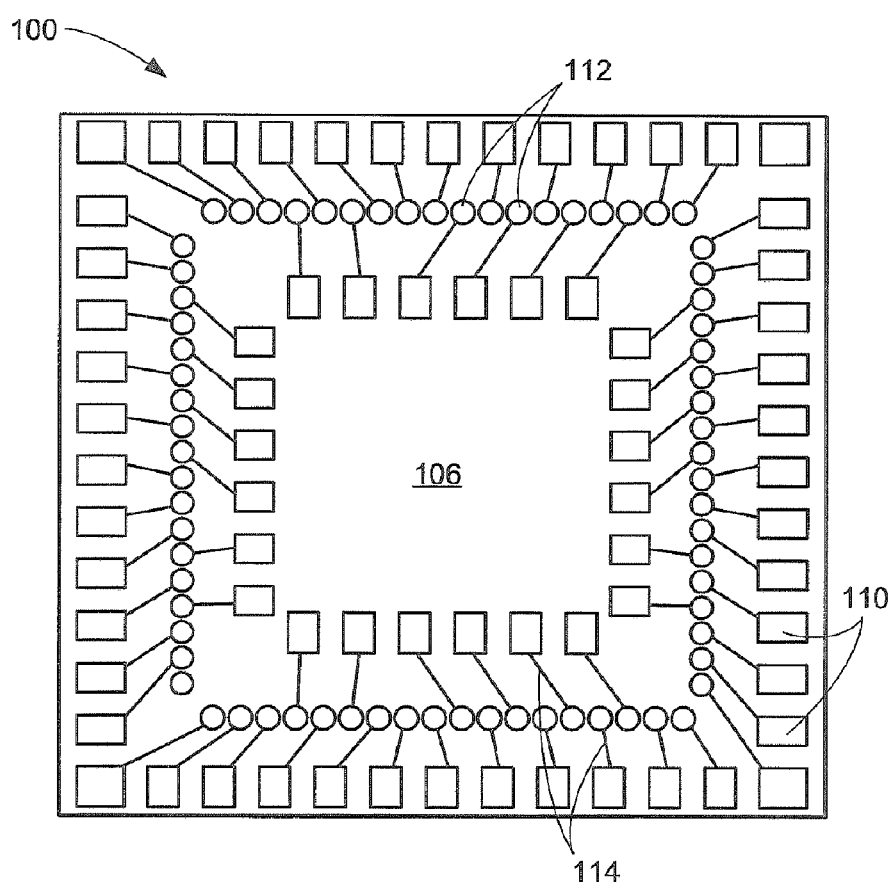
FIG. 14 is a bottom view of the bump chip carrier semiconductor package system in the singulation phase.

Referring now to FIG. 14, therein is shown a bottom view of the bump chip carrier semiconductor package system 100 in the singulation phase. The bottom view depicts the terminal bumps 110 at the boundary and at the inner area of the bump chip carrier semiconductor package system 100. The circuit sockets 112 are shown between the terminal bumps 110 located at the boundary and the terminal bumps 110 located at the inner area. The lead frame interconnects 114 are shown electrically connecting the circuit sockets 112 to the terminal bumps 110 as desired. The molding compound 106 is shown surrounding the terminal bumps 110, the circuit sockets 112, and the lead frame interconnects 114.

Figure 15:
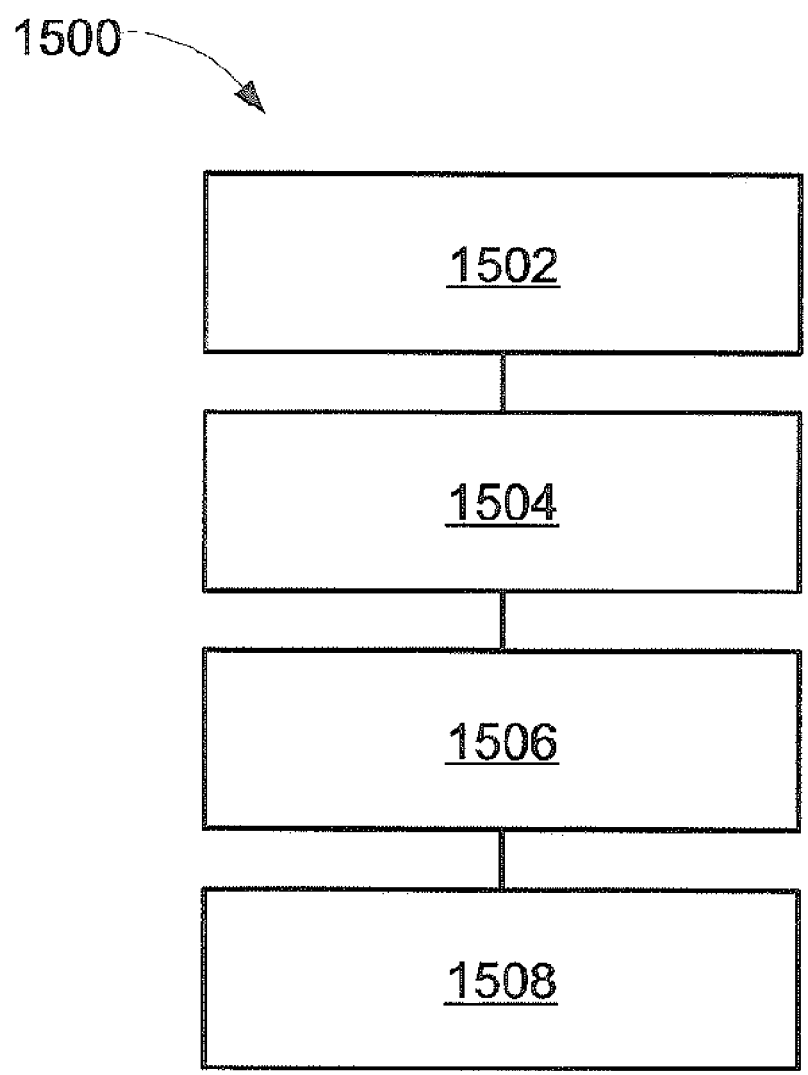
FIG. 15 is a flow chart of a system for a bump chip carrier semiconductor package system in an embodiment of the present invention.

Referring now to FIG. 15, therein is shown a flow chart of a system 1500 for a bump chip carrier semiconductor package system in an embodiment of the present invention. The system 1500 includes providing a lead frame in a block 1502; forming circuit sockets in the lead frame in a block 1504; mounting a semiconductor die on the lead frame, wherein the semiconductor die have electrical interconnects that connects to the circuit sockets in a block 1506; and encapsulating a molding compound to cover the semiconductor die and the electrical interconnects in a block 1508.

It has been discovered that the present invention thus has numerous aspects.

It has been discovered that a bump chip carrier semiconductor package system can achieve lower profiles and support higher input/output pin counts that were previously unattained. The flip chip interface with the bump chip carrier package support higher pin counts and the flip chip bumps reduces the package height.

An aspect is that the present invention provides lower height through flip chip mounting. The active side of the semiconductor die is protected by the molding compound allowing for even lower package profiles with the non-active side exposed.

Another aspect of the present invention is the improved signal integrity performance and thermal management. The lead frame interconnects may be grouped as desired to provide thermal paths to the external printed circuit board. Also, the lead frame interconnects may be grouped to provide power supply or ground wells as desired. The circuit sockets or flip chip bond paddle may be used to provide lower resistive paths directly to the semiconductor die as desired. The terminal bumps may be placed below the semiconductor die and filled with thermally conductive materials to provide additional heat sink functions.

Yet another aspect of the present invention is cost reduction. The lead frame interconnects eliminates the need for a separate substrate for the semiconductor die thereby reducing both materials cost and yield fallout. The lead frame interconnects may be multi-layered to further increase the pin count while alleviating the need for a separate substrate. The circuit sockets or flip chip bond paddles may be used as test point or probes during package test and system test. The trace protective material or a similar protective layer may protect the test points until needed. The terminal bumps and the flip chip bond paddles may be configured and arranged to allow stacking of the bump chip carrier semiconductor package.

Yet another important aspect of the present invention is that it valuably supports and services the historical trend of reducing costs, simplifying systems, and increasing performance. These and other valuable aspects of the present invention consequently further the state of the technology to at least the next level.

Thus, it has been discovered that the bump chip carrier semiconductor package system method of the present invention furnishes important and heretofore unknown and unavailable solutions, capabilities, and functional aspects for increasing chip density in systems. The resulting processes and configurations are straightforward, cost-effective, uncomplicated, highly versatile and effective, can be implemented by adapting known technologies, and are thus readily suited for efficiently and economically manufacturing stacked integrated circuit packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A method for manufacturing a bump chip carrier semiconductor package system comprising:
   providing a lead frame having circuit sockets formed to a concave shape;
   mounting a semiconductor die on the lead frame, wherein the semiconductor die faces the concavities of the circuit sockets and has electrical interconnects that extend into and connect to bottoms of the circuit sockets; and
   encapsulating the semiconductor die and the compound filling a space around the electrical interconnects in the circuit sockets with a molding compound.

2. The method as claimed in claim 1 further comprising:
   forming terminal bumps in the lead frame;
   connecting lead frame interconnects to the terminal bumps and the circuit sockets to redistribute an electrical signal; and
   applying a trace protective material to protect the lead frame interconnects.

3. The method as claimed in claim 1 wherein forming the circuit sockets in the lead frame comprises plating the lead frame with conductive materials.

4. The method as claimed in claim 1 wherein mounting the semiconductor die on the lead frame comprises connecting flip chip bumps from the semiconductor die to the circuit sockets.

5. The method as claimed in claim 1 wherein encapsulating the semiconductor die and the electrical interconnects comprises filling a space between the semiconductor die and the lead frame with the molding compound.

6. A method for manufacturing a bump chip carrier semiconductor package system comprising:
   providing a lead frame having circuit sockets formed to a concave shape;
   forming terminal bumps in the lead frame;
   connecting lead frame interconnects to the terminal bumps and the circuit sockets to redistribute an electrical signal;
   mounting a semiconductor die on the lead frame, wherein the semiconductor die faces the concavities of the circuit sockets and has electrical interconnects that extend into and connect to bottoms of the circuit sockets; and
   encapsulating the semiconductor die and the electrical interconnects with a molding compound, the molding compound filling a space around the electrical interconnects in the circuit sockets.

7. The method as claimed in claim 6 further comprising half etching terminal recesses, pad recesses, and interconnect channels in the lead frame to form the terminal bumps, the circuit sockets, and the lead frame interconnects, respectively.

8. The method as claimed in claim 6 wherein encapsulating the semiconductor die and the electrical interconnects comprises exposing a non-active side of the semiconductor die.

9. The method as claimed in claim 6 further comprising exposing bottoms of the terminal bumps and the circuit sockets by a chemical etch of the lead frame.

10. The method as claimed in claim 6 wherein providing the lead frame comprises forming a metallic alloy to form the lead frame.

11. A bump chip carrier semiconductor package system comprising:
    a lead frame having circuit sockets formed to a concave shape;
    a semiconductor die on the lead frame, wherein the semiconductor die faces the concavities of the circuit sockets and has electrical interconnects that extend into and connect to bottoms of the circuit sockets; and
    a molding compound for encapsulating the semiconductor die and the electrical interconnects, the molding compound filling a space around the electrical interconnects in the circuit sockets.

12. The system as claimed in claim 11 further comprising:
    terminal bumps formed in the lead frame;
    lead frame interconnects for connecting the terminal bumps and the circuit sockets to redistribute an electrical signal; and
    a trace protective material for protecting the lead frame interconnects.

13. The system as claimed in claim 11 wherein the circuit sockets in the lead frame are conductive materials plated on the lead frame.

14. The system as claimed in claim 11 further comprising flip chip bumps connect semiconductor die to the circuit sockets.

15. The system as claimed in claim 11 wherein the molding compound fills a space between the semiconductor die and the lead frame.

16. The system as claimed in claim 11 further comprising:
   the lead frame has terminal bumps formed in the lead frame; and
   lead frame interconnects connected to the terminal bumps and the circuit sockets to redistribute an electrical signal.

17. The system as claimed in claim 16 further comprising terminal recesses, pad recesses, and interconnect channels in the lead frame for forming the terminal bumps, the circuit sockets, and the lead frame interconnects, respectively.

18. The system as claimed in claim 16 wherein the molding compound does not cover a non-active side of the semiconductor die.

19. The system as claimed in claim 16 wherein the lead frame does not cover the bottoms of the terminal bumps and the circuit sockets.

20. The system as claimed in claim 16 wherein the lead frame is a metallic alloy.

* * * * *